United States Patent
Jones (10) Patent No.: US 9,276,552 B2
(45) Date of Patent: Mar. 1, 2016

(54) OUTPUT MATCH DIRECTIONAL COUPLER

(71) Applicant: RF Micro Devices, Inc., Greensboro, NC (US)

(72) Inventor: David E. Jones, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/497,471

(22) Filed: Sep. 26, 2014

(65) Prior Publication Data

US 2015/0084715 A1    Mar. 26, 2015

Related U.S. Application Data

(60) Provisional application No. 61/882,779, filed on Sep. 26, 2013.

(51) Int. Cl.
| | | |
|---|---|---|
| *H01P 5/18* | (2006.01) | |
| *H03H 7/40* | (2006.01) | |
| *H03F 1/56* | (2006.01) | |
| *H03F 3/189* | (2006.01) | |
| *H03F 3/195* | (2006.01) | |
| *H03H 7/09* | (2006.01) | |

(52) U.S. Cl.
CPC ............... *H03H 7/40* (2013.01); *H03F 1/565* (2013.01); *H03F 3/189* (2013.01); *H03F 3/195* (2013.01); *H03F 2200/387* (2013.01); *H03F 2200/423* (2013.01); *H03F 2200/451* (2013.01); *H03F 2200/541* (2013.01)

(58) Field of Classification Search
CPC .................................. H01P 5/15; H01P 5/184
USPC .......................................... 333/109–112, 116
See application file for complete search history.

(56) References Cited

U.S. PATENT DOCUMENTS

| | | | | |
|---|---|---|---|---|
| 7,417,516 B2* | 8/2008 | Singh | ........................ | H01P 5/04 333/109 |
| 7,705,692 B2* | 4/2010 | Fukamachi | ............ | G01R 21/10 333/109 |
| 7,907,032 B2* | 3/2011 | Yamamoto | ................ | H01P 5/18 333/116 |
| 8,315,576 B2* | 11/2012 | Jones | ...................... | H01P 5/184 333/109 |
| 2007/0069820 A1* | 3/2007 | Hayata | .................... | H03F 1/301 330/298 |

OTHER PUBLICATIONS

Carson, Ralph S., High-Frequency Amplifiers. 2nd Ed., New York: Wiley, 1982. pp. 214-216.

\* cited by examiner

*Primary Examiner* — Dean Takaoka
(74) *Attorney, Agent, or Firm* — Withrow & Terranova, P.L.L.C.

(57) ABSTRACT

A directional coupler that provides directional coupling and an impedance transformation is disclosed. In one embodiment, the directional coupler includes a low pass filter having a filter inductor that is coupled between an input port and an output port and a filter capacitor coupled between the output port and ground. The directional coupler also includes detector circuitry wherein the filter inductor is magnetically coupled to a detector inductor in the detector circuitry such that current passing through the filter inductor generates a detector current through the detector inductor. Furthermore, the low pass filter and the detector circuitry cooperate to transform a first impedance presented at the output port to a second impedance presented at the input port. Accordingly, the filter inductor is used in the low pass filter to provide an impedance transformation so as to operate with the detector circuitry to provide a detector current for directional coupling.

30 Claims, 7 Drawing Sheets

OUTPUT MATCH DIRECTIONAL COUPLER

RELATED APPLICATIONS

This application claims the benefit of provisional patent application Ser. No. 61/882,779, filed Sep. 26, 2013, the disclosure of which is hereby incorporated herein by reference in its entirety.

FIELD OF THE DISCLOSURE

This disclosure relates generally to directional couplers.

BACKGROUND

There is always pressure to reduce the number of components in radio frequency (RF) systems in order to reduce the cost and size of the RF systems. For example, RF amplification devices include RF amplification circuits that amplify an RF signal for delivery to a load. In order to couple the RF amplification circuit to the load, these RF amplification devices often employ various circuits between the RF amplification circuit and the load that provide different types of functionality. For instance, a low pass filter is often employed in order to transform a load impedance of the load to an impedance of the RF amplification circuit. A directional coupler is also typically connected between the low pass filter and the load so that control circuitry can adequately measure the RF signal and control the RF amplification circuit. Unfortunately, the low pass filter and the directional coupler have different components, which results in increased cost and the consumption of significant amounts of space. Accordingly, circuitry with more compact arrangements is needed between the RF amplification circuit and the load.

SUMMARY

This disclosure relates generally to directional couplers, methods for operating directional couplers, and systems associated with directional couplers. In one embodiment, a directional coupler includes an input port, an output port, a low pass filter, and detector circuitry. By having the directional coupler include the low pass filter, components of the low pass filter can provide both an impedance transformation and provide directional coupling. Thus, the directional coupler can be used to reduce the number of components in an RF amplification device or in other RF circuitry. For example, the low pass filter may include a filter inductor coupled between the input port and the output port and a filter capacitor that is coupled between the output port and ground. The detector circuitry may be coupled to the filter inductor and have a detector inductor. A first inductance of the filter inductor is greater than the second inductance of the detector inductor. The filter inductor is magnetically coupled to the detector inductor in the detector circuitry such that current passing through the filter inductor generates a detector current through the detector inductor. Furthermore, the low pass filter and the detector circuitry cooperate to transform a first impedance presented at the output port to a second impedance presented at the input port. As such, the filter inductor is used in the low pass filter to provide an impedance transformation so as to operate with the detector circuitry to generate a detector current in order to provide directional coupling.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims. Also, throughout this disclosure and the accompanying claims, relative terminology, such as "approximately," "substantially," and the like, may be used in a predicate to describe elements, characteristics and relationships between elements or characteristics of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by the particular RF application employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred. With regard to the term "port" in this disclosure and in the claims, the term "port" refers to any conductive feature in an electronic component for receiving signals, transmitting signals, and/or establishing a connection to another electronic component. For instance, a port may be a node, a conductive pad, a pin, a solder bump, a terminal, a lead, and/or the like.

This disclosure relates generally to directional couplers, methods for operating directional couplers, and radio frequency (RF) systems (e.g., RF amplification devices) that use directional couplers. The directional couplers are designed both to provide an impedance transformation and to provide directional coupling. More particularly, the directional couplers are designed to provide both an impedance transformation and directional coupling with a common set of components, and thus separate circuitry is not necessary to provide the impedance transformation and directional coupling. Accordingly, the directional couplers disclosed herein may be used to reduce cost and size of an RF system.

Figure 1:
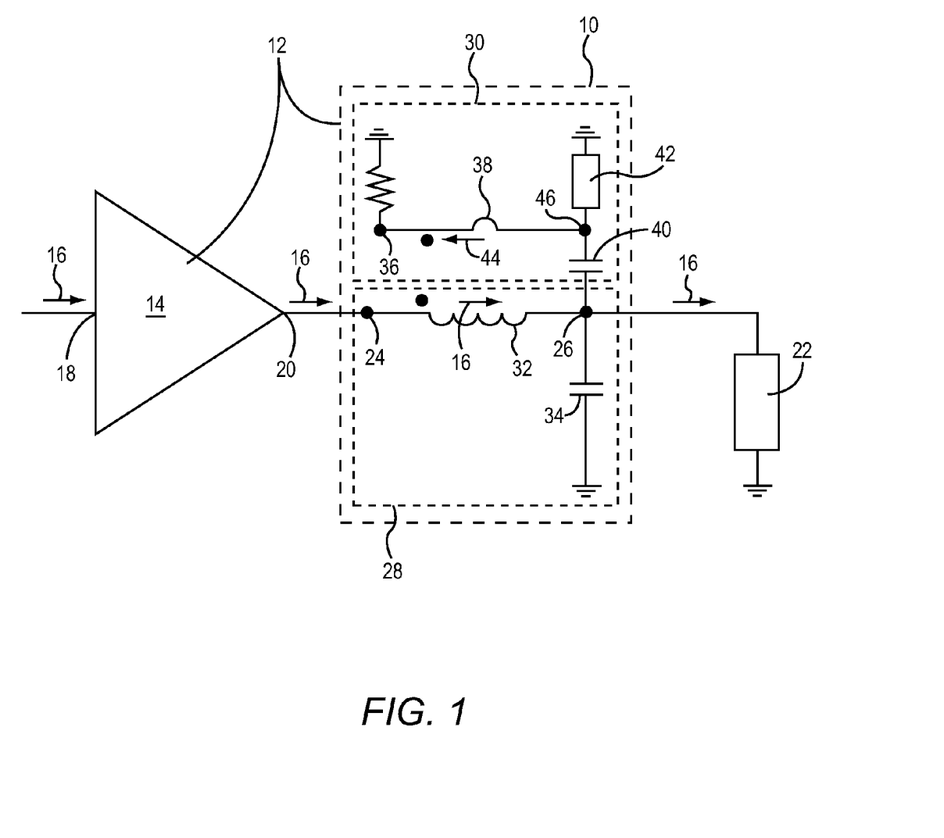
FIG. 1 illustrates one embodiment of a directional coupler provided in an RF amplification device, wherein the directional coupler has a low pass filter with a filter inductor and detector circuitry coupled to the filter inductor by being coupled to an output port.

FIG. 1 illustrates one embodiment of a directional coupler 10 capable of providing both an impedance transformation and directional coupling. The directional coupler 10 shown in FIG. 1 is provided in an RF amplification device 12. More specifically, the RF amplification device 12 includes an RF amplification circuit 14 and the directional coupler 10. It should be noted that the directional coupler 10 in FIG. 1 and described throughout this disclosure may also be provided in any other type of RF system, not just an RF amplification device like the RF amplification device 12 shown in FIG. 1.

The RF amplification circuit 14 is configured to amplify an RF signal 16 and is operably associated with the directional coupler 10. More specifically, the RF amplification circuit 14 includes an amplifier input terminal 18 and an amplifier output terminal 20. The RF amplification circuit 14 is configured to receive the RF signal 16 at the amplifier input terminal 18 and transmit the RF signal 16 from the amplifier output terminal 20 once the RF amplification circuit 14 has amplified the RF signal 16. The RF signal 16 is received by the directional coupler 10 from the amplifier output terminal 20. The directional coupler 10 is configured to be coupled to a load 22. In this embodiment, the directional coupler 10 is shown to be connected between the RF amplification circuit 14 and the load 22.

It should be noted that the RF amplification circuit 14 may be any type of amplification circuit configured to amplify the RF signal 16. For example, the RF amplification circuit 14 may be a single stage amplification circuit or a multi stage amplification circuit. Furthermore, the signal stage amplification circuit or the stages of the multi-stage amplification circuit may be each be formed using a transistor, such as a field effect transistor (FET) or bipolar junction transistor (BJT), or with a network of transistors. The RF signal 16 may also be any type of RF signal within any RF communication band. For example, the RF signal 16 may be encoded using time division multiplexing (TDM), frequency division multiplexing (FDM), space division multiplexing (SDM), code division multiple access multiplexing (CDMA), orthogonal frequency division multiple access multiplexing (OFDMA), and/or the like. Additionally, the RF amplification device 12 may be configured to amplify the RF signal 16 when the RF signal 16 is formatted in accordance to one or more RF communication standards. For example, the RF signal 16 may be formatted in accordance with 2G Global System for Mobile Communications (GSM) standards, 3G standards, 4G Long Term Evolution (LTE) standards, and/or the like. Furthermore, the RF amplification circuit 14 may amplify the RF signal 16 when the RF signal 16 is formatted in accordance to one or more specifications within these RF communication standards, along with their respective RF communication bands. For instance, the RF signal 16 may be formatted in accordance with and in RF communication bands defined by specifications of the 2G GSM standard, such as a Digital Communication System (DCS) specification, a Personal Communications Service (PCS) specification, a GSM-850 specification, and a GSM-900 specification; specifications within the 3G standard, such as an Enhanced Data Rates for GSM Evolution (EDGE)-850 specification, an EDGE-950 specification, an EDGE-1800 specification, and an EDGE-1900 specification; and specifications within the 4G LTE standard, such as a Mobile Device Management (MDM) specification, a High Speed Packet Access (HSPA) specification, and/or the like.

As shown in FIG. 1, the directional coupler 10 includes an input port 24, and output port 26, a low pass filter 28, and detector circuitry 30. In this embodiment, the input port 24 is coupled to the amplifier output terminal 20 while the output port 26 is coupled to the load 22. The low pass filter 28 has a filter inductor 32 and a filter capacitor 34. The filter inductor 32 is coupled between the input port 24 and the output port 26. Thus, in this embodiment, the filter inductor 32 is connected in series with the RF amplification circuit 14 between the amplifier output terminal 20 and the load 22. The filter capacitor 34 is coupled between the output port 26 and ground. Thus, in this embodiment, the filter capacitor 34 is coupled in shunt with respect to the load 22.

As such, the filter inductor 32 is a series coupled inductor and the filter capacitor 34 is a shunt capacitor of the low pass filter 28. The filter inductor 32 has a first inductance, and the filter capacitor 34 has a first capacitance. The first inductance and the first capacitance are provided so that the low pass filter 28 has a low pass filtering response. The directional coupler 10 is thus configured such that the RF signal 16 is received at the input port 24 from the amplifier output terminal 20, passes through the filter inductor 32, and is transmitted from the output port 26 to the load 22. As such, a current of the RF signal 16 passes through the filter inductor 32 of the low pass filter 28 from the input port 24 to the output port 26 of the directional coupler 10. The RF signal 16 is filtered in accordance with the low pass filtering response of the low pass filter 28 once the RF signal 16 is transmitted from the output port 26 to the load 22.

The detector circuitry 30 is coupled to the filter inductor 32. In this embodiment, the detector circuitry 30 is coupled to the filter inductor 32 by being connected to the output port 26. The detector circuitry 30 shown in FIG. 1 has a coupled port 36, a detector inductor 38 coupled to the coupled port 36, a sampling capacitor 40 coupled between the filter inductor 32 and the detector inductor 38, and a coupler termination 42 coupled between the detector inductor 38 and ground. The detector inductor 38 has a second inductance. The first inductance of the filter inductor 32 is greater than the second inductance of the detector inductor 38. As such, the detector inductor 38 in the detector circuitry 30 may be relatively small in comparison to the filter inductor 32 in the low pass filter 28. However, the detector inductor 38 is magnetically coupled to the filter inductor 32. In this manner, a detector signal 44 is generated from the RF signal 16 and across the detector inductor 38 so that the RF signal 16 can be measured using the detector signal 44. More specifically, the detector signal 44 has a detector current that is transmitted across the detector inductor 38 and out of the coupled port 36. The detector inductor 38 is magnetically coupled to the filter inductor 32 such that the current of the RF signal 16 passing through the filter inductor 32 generates the detector current of the detector signal 44 through the detector inductor 38. The magnetic coupling between the filter inductor 32 and the detector inductor 38 is described in accordance to standard dot convention. The directional coupler 10 thus provides directional coupling, and the detector current of the detector signal 44 is transmitted from the coupled port 36.

In this manner, control circuitry (not explicitly shown) may receive the detector signal 44 in order to measure a characteristic of the RF signal 16, such as the current of the RF signal 16 or power of the RF signal 16 using the detector signal 44 as feedback from the RF amplification circuit 14. The control circuitry is not in the directional coupler 10, but an impedance of the control circuitry is represented by a resistor connected at the coupled port 36. The control circuitry may be internal to the RF amplification device 12, external to the RF amplification device 12, or partially internal and partially external to the RF amplification device 12. In any case, the control circuitry may be coupled to the coupled port 36 in order to control the RF amplification circuit 14. For example, the control circuitry may control a gain of the RF amplification circuit 14 and use the detector signal 44 to provide information about the RF signal 16 in order to set the gain.

Additionally, the low pass filter 28 and the detector circuitry 30 cooperate to transform a first impedance presented at the output port 26 to substantially a second impedance presented at the input port 24. With regard to the directional coupler 10 shown in FIG. 1, the first impedance is a load impedance of the load 22 presented to the directional coupler 10 at the output port 26, while the second impedance is an amplifier impedance of the RF amplification circuit 14 presented to the directional coupler 10 at the input port 24 from the amplifier output terminal 20. Accordingly, the directional coupler 10 is also used to transform the first impedance (e.g., the load impedance of the load 22) presented at the output port 26 to the second impedance (e.g., the amplifier impedance at the amplifier output terminal 20) to increase power transfer. As a result, the directional coupler 10 provides both directional coupling and an impedance transformation. Accordingly, separate devices are not required between the RF amplification circuit 14 and the load 22 to provide the different functions. As a result, the RF amplification device 12 only has the directional coupler 10 connected between the RF amplification circuit 14 and the load 22. The RF amplification device 12 may thus have a more compact arrangement than other amplification devices that use separate devices to provide the impedance transformation and the directional coupling.

As explained in further detail below, the low pass filter 28 and the detector circuitry 30 cooperate to ensure that a directivity of the directional coupler 10 is relatively high, and thus the detector signal 44 provides a measure of the RF signal 16 that is being transmitted from the input port 24 to the output port 26 and is thus being delivered to the load 22. In this manner, the directional coupler 10 can provide directional coupling. More specifically, the detector circuitry 30 is configured so as to increase directivity between a forward signal voltage of the RF signal 16 at the output port 26 (to the load 22) and a coupled voltage of the detector signal 44 at the coupled port 36. The detector circuitry 30 is also configured to minimize power reflections from the output port 26 (and the load 22) to the input port 24 (and the RF amplification circuit 14). To do this, the detector circuitry 30 is configured to balance the current of the RF signal 16 through the filter inductor 32 with the detector current of the detector signal 44 through the detector inductor 38.

The ability to provide both directional coupling and an impedance transformation is due to the arrangement and relationship between the low pass filter 28 and the detector circuitry 30 of the directional coupler 10. In this embodiment, the sampling capacitor 40 of the detector circuitry 30 is coupled between the output port 26 and the detector inductor 38 such that the detector inductor 38 is coupled between the sampling capacitor 40 and the coupled port 36. The coupler termination 42 of the detector circuitry 30 is coupled between the sampling capacitor 40 and ground. More specifically, the sampling capacitor 40, the detector inductor 38, and the coupler termination 42 are each connected to a common connection node 46.

Now, if $V_T$ is an output voltage of the RF signal 16 at the output port 26 and $I_T$ is the current of the RF signal 16 entering the output port 26, then:

$$V_T = V_+ + V_- \tag{1}$$

$$I_T = I_+ + I_- \tag{2}$$

where $V_+$ is the forward signal voltage of the RF signal 16 at the output port 26, $V_-$ is a reflected signal voltage of the RF signal 16 at the output port 26, $I_+$ is a forward signal current of the RF signal 16 into the output port, and $I_-$ is a reflected signal current of the RF signal 16 from the output port 26 back towards the input port 24. If $V_V$ represents a sampled voltage at the common connection node 46, $V_o$ is a voltage at the coupled port 36, and $V_I$ is an inductor voltage across the detector inductor 38 from the coupled port 36 to the common connection node 46, then:

$$V_V \sim V_T * [Z_t/(Z_t + 1/j\omega C_t)] \tag{3}$$

$$V_o = V_V + V_I \tag{4}$$

With regard to equations (3) and (4) above, $Z_t$ is a coupler termination impedance of the coupler termination 42, $C_t$ is a capacitance of the sampling capacitor 40, and $\omega$ is an angular frequency of the RF signal 16. Now, if $Z_t$ is assumed to be significantly smaller than $j\omega C_t$, then equation (3) above reduces to:

$$V_V \sim V_T * (Z_t * j\omega C_t) \tag{5}$$

A mutual coupling factor between the detector inductor 38 and the filter inductor 32 is set in accordance to the second inductance of the detector inductor 38 and the first inductance of the filter inductor 32. If the mutual coupling factor between the detector inductor 38 and the filter inductor is represented by $M_t$, then:

$$V_I \sim j\omega M_t I_T \tag{6}$$

Plugging equations (5) and (6) above into equation (4) results in:

$$V_O \sim V_T * (Z_t * j\omega C_t) + j\omega M_t I_T \tag{7}$$

Plugging equations (1) and (2) into equation (7) results in:

$$V_O \sim (Z_t * j\omega C_t)(V_+ + V_-) + j\omega M_t I_T (I_+ + I_-) \tag{8}$$

If the first impedance presented at the output port 26 is represented by Zo, equation (1) and (2) can be related as follows:

$$(I_+ + I_-) = (V_+ + V_-)/Z_O \tag{9}$$

Given equation (9) and the mutual coupling factor $M_t$, equation (9) can be rewritten as:

$$V_O \sim (j\omega C_t R + j\omega M_t/Z_O) V_+ + (j\omega C_t R - j\omega M_t/Z_O) V_- \tag{10}$$

where R is the impedance (a resistance) at the coupled port 36.

Given equation (10), it is clear that a directivity of the directional coupler 10 is maximized when $j\omega C_t Z_t - j\omega M_t/Z_O \sim 0$. When $j\omega C_t Z_t - j\omega M_t/Z_O \sim 0$, then:

$$Z_t * C_t \sim M_t/Z_O \quad (11)$$

$$V_O \sim (2j\omega C_t Z_t/Z_O) V_+ \quad (12)$$

Thus, for a particular angular frequency ω of the RF signal 16 of interest, the first inductance of the filter inductor 32, the second inductance of the detector inductor 38, the capacitance $C_t$ of the sampling capacitor 40, and the coupler termination impedance of the coupler termination 42 are selected so that Equation (11) is satisfied. As shown by equations (8) and (12), by being connected between the output port 26 and the common connection node 46, the sampling capacitor 40 is configured to provide the sampled voltage $V_V$ based on the output voltage $V_T$ at the output port 26 such that the sampled voltage $V_V$ adjusts the inductor voltage $V_I$ across the detector inductor 38. The coupler termination 42 has the termination impedance $Z_t$ that provides a weight to the sampled voltage $V_V$. By selecting the termination impedance $Z_t$ of the coupler termination 42 appropriately, the weight provided by the termination impedance $Z_t$ to the sampled voltage $V_V$ substantially balances the current of the RF signal 16 across the filter inductor 32 and the detector current of the detector signal 44 across the detector inductor 38. Furthermore, the weight provided by the coupler termination impedance $Z_t$ to the sampled voltage $V_V$ substantially balances the output voltage $V_T$ at the output port with the coupled voltage $V_O$ at the coupled port 36, and it increases the directivity between the forward signal voltage $V_+$ at the output port 26 and the coupled voltage $V_O$ at the coupled port 36. Essentially, the detector circuitry 30 samples the output voltage $V_T$ to provide the sampled voltage $V_V$ with the sampling capacitor 40 and superimposes the sampled voltage $V_V$ onto the detector signal 44. The coupler termination impedance of the coupler termination 42 provides the appropriate weight to the sampled voltage $V_V$ so that voltages and current at the output port 26 and the coupled port 36 are balanced. Thus, the greater the directivity of the directional coupler 10, the closer equation (11) is to being satisfied for the particular angular frequency ω of the RF signal 16 of interest. More specifically, when equation (11) is satisfied for the particular ω of the RF signal 16 of interest, the directivity of the directional coupler is approximately maximized.

However, as mentioned above, the low pass filter 28 and the detector circuitry 30 cooperate to transform the first impedance (represented by $Z_o$) presented at the output port 26 to substantially the second impedance (e.g., the amplifier impedance at the amplifier output terminal 20) presented at the input port 24. With regard to the directional coupler 10 shown in FIG. 1, the first impedance is a load impedance of the load 22 presented to the directional coupler 10 at the output port 26, while the second impedance is an amplifier impedance of the RF amplification circuit 14 presented to the directional coupler 10 at the input port 24 from the amplifier output terminal 20. Thus, for the particular angular frequency ω of the RF signal 16 of interest, the low pass filter 28 and the detector circuitry 30 cooperate so that an impedance seen at the input port 24 towards the output port 26 and the load 22 is substantially the same as the second impedance seen at the input port 24 towards the RF amplification circuit 14. Let the impedance seen at the input port 24 towards the output port 26 be represented by $Z_O'$ and the second impedance presented at the input port 24 be Zi. If $T_r$ represents an impedance transformation provided by the directional coupler 10 from the output port 26 to the input port 24, then:

$$Z_O' = T_r Z_O \quad (13)$$

Since the low pass filter 28 and the detector circuitry 30 cooperate to transform the first impedance (represented by $Z_O$) presented at the output port 26 to substantially the second impedance (e.g., the amplifier impedance at the amplifier output terminal 20) presented at the input port 24, then:

$$Z_i \sim Z_O' \quad (14)$$

Accordingly, the first inductance of the filter inductor 32, the second inductance of the detector inductor 38, the first capacitance of the filter capacitor 34, the capacitance $C_t$ of the sampling capacitor 40, and the coupler termination impedance $Z_t$ of the coupler termination 42 are selected so that the impedance transformation $T_r$ provided by the directional coupler 10 from the output port 26 to the input port 24 satisfies equation (14). As such, the directional coupler 10 minimizes power reflections from the output port 26 to the input port 24. For instance, a magnitude of the second impedance (e.g., the amplifier impedance at the amplifier output terminal 20) is generally smaller than a magnitude of the first impedance (e.g., the load impedance of the load 22) at the output port 26. In one example, the magnitude of the second impedance is 2 Ohms while the magnitude of the first impedance is 50 Ohms. In this embodiment, the first inductance of the filter inductor 32, the second inductance of the detector inductor 38, the first capacitance of the filter capacitor 34, the capacitance $C_t$ of the sampling capacitor 40, and the coupler termination impedance $Z_t$ of the coupler termination 42 are selected so that the impedance transformation $T_r$ provided by the directional coupler 10 from the output port 26 to the input port 24 satisfies equation (14). With regards to the specific example, the 50 Ohm magnitude of the first impedance is transformed to approximately 2 Ohms at the input port 24. As such, the first inductance of the filter inductor 32 can be greater than the second inductance of the detector inductor 38, while still providing the appropriate impedance transformation.

Also in this embodiment, the first inductance of the filter inductor 32, the second inductance of the detector inductor 38, the first capacitance of the filter capacitor 34, the capacitance $C_t$ of the sampling capacitor 40, and the coupler termination impedance $Z_t$ of the coupler termination 42 are selected so that the impedance transformation $T_r$ provided by the directional coupler 10 from the output port 26 to the input port 24 satisfies equation (14) and so that equation (11) is satisfied. As a result, the directional coupler 10 thus provides an impedance transformation and directional coupling. In this manner, the filter inductor 32 can be used both for the impedance transformation and for direct coupling even though the first inductance of the filter inductor 32 can be greater than the second inductance of the detector inductor 38. Accordingly, the RF amplification device 12 does not need a separate low pass filter between the RF amplification circuit 14 and the load 22. Thus, the directional coupler 10 allows for the RF amplification device 12 to have a more compact arrangement.

Figure 2:
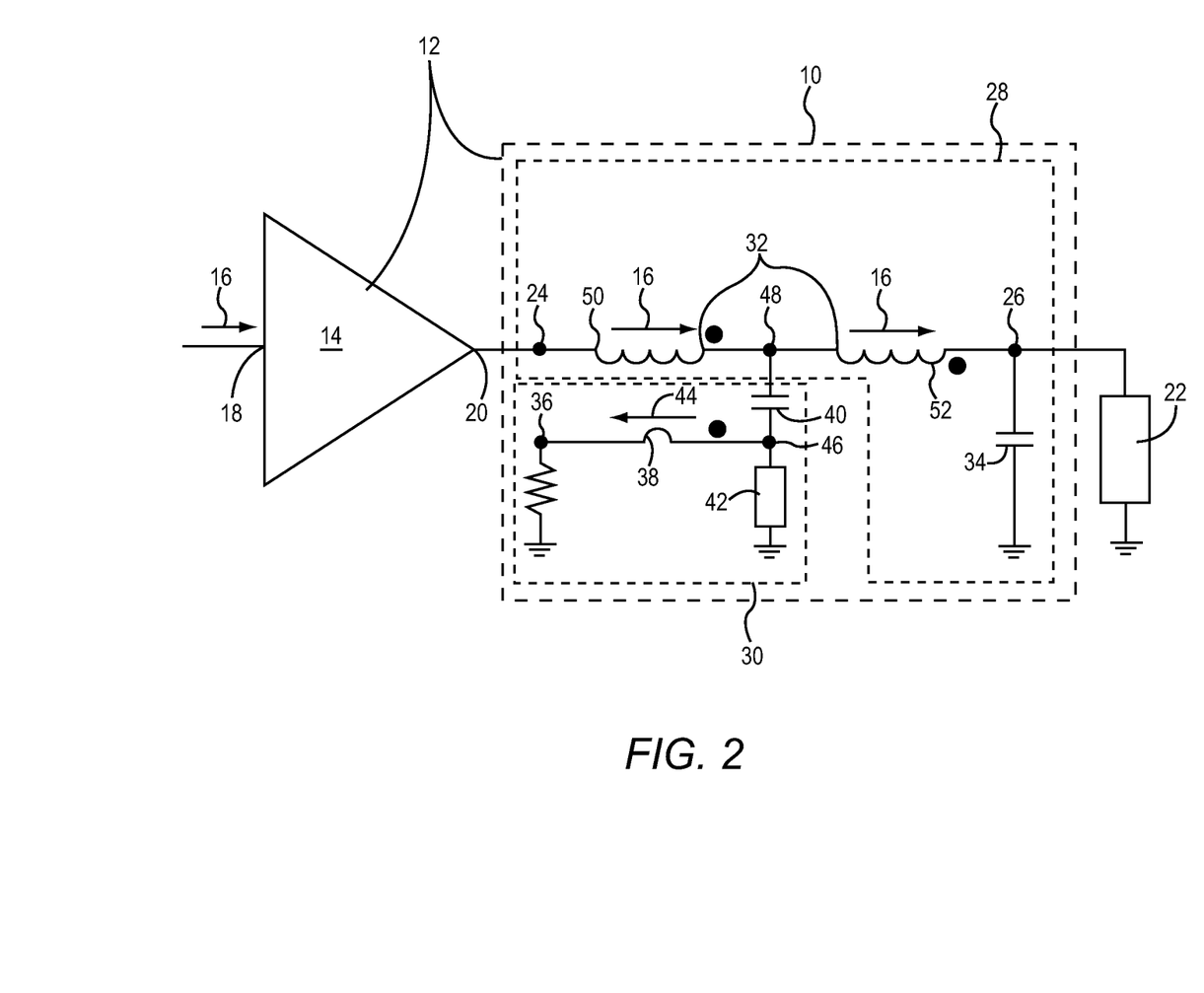
FIG. 2 illustrates another embodiment of a directional coupler provided in an RF amplification device, wherein the directional coupler has a low pass filter with a filter inductor and detector circuitry coupled to an intermediate tap of the filter inductor.

FIG. 2 illustrates another embodiment of the directional coupler 10 provided in the RF amplification device 12. The directional coupler 10 is the same as the one shown in FIG. 1, except that in this embodiment, the detector circuitry 30 is connected to an intermediate tap 48 of the filter inductor 32 rather than to the output port 26. The sampling capacitor 40 is thus coupled between the intermediate tap 48 and the common connection node 46. Furthermore, the detector inductor 38 is magnetically coupled to a first portion 50 of the filter inductor 32 and not to a second portion 52 of the filter inductor 32. The first portion 50 of the filter inductor 32 is connected between the input port 24 and the intermediate tap 48. In this embodiment, the first portion 50 of the filter inductor 32 has an inductance that is greater than the second inductance of the detector inductor 38. The second portion 52 of the filter inductor 32 is connected between the intermediate tap 48 and the output port 26.

In this case, the detector circuitry 30 is adjusted to account for the fact that the detector circuitry 30 is connected at the intermediate tap 48 and thus also operates into an inductance of the second portion 52 of the filter inductor 32. The second portion 52 is in series with a parallel combination of the filter capacitor 34 and the load 22. More specifically, the sampling capacitor 40 is thus coupled between the intermediate tap 48 and the detector inductor 38 such that the detector inductor 38 is coupled between the sampling capacitor 40 and the coupled port 36. The sampling capacitor 40 is configured to generate the sampled voltage $V_V$ based on an intermediate voltage at the intermediate tap 48 such that the sampled voltage $V_V$ adjusts the inductor voltage $V_I$ across the detector inductor 38. The coupler termination impedance $Z_t$ is therefore set to provide a weight to the sample voltage $V_V$ provided by the sampling capacitor 40 from the intermediate tap 48. Similar to the embodiment described above in FIG. 1, the weight provided by the coupler termination impedance $Z_t$ to the sampled voltage $V_V$ substantially balances with the coupled voltage $V_O$ at the coupled port 36 with the intermediate voltage at the intermediate tap 48, substantially balances the current and voltages across the first portion 50 of the filter inductor 32 and the detector inductor 38, and increases directivity between the input port 24 and the intermediate tap 48 (including increasing the directivity of the forward signal voltage at the intermediate tap 48). The low pass filter 28 and the detector circuitry 30 also cooperate to transform the first impedance (represented by $Z_O$) presented at the output port 26 to substantially the second impedance (e.g., the amplifier impedance at the amplifier output terminal 20) presented at the input port 24.

Figure 3:
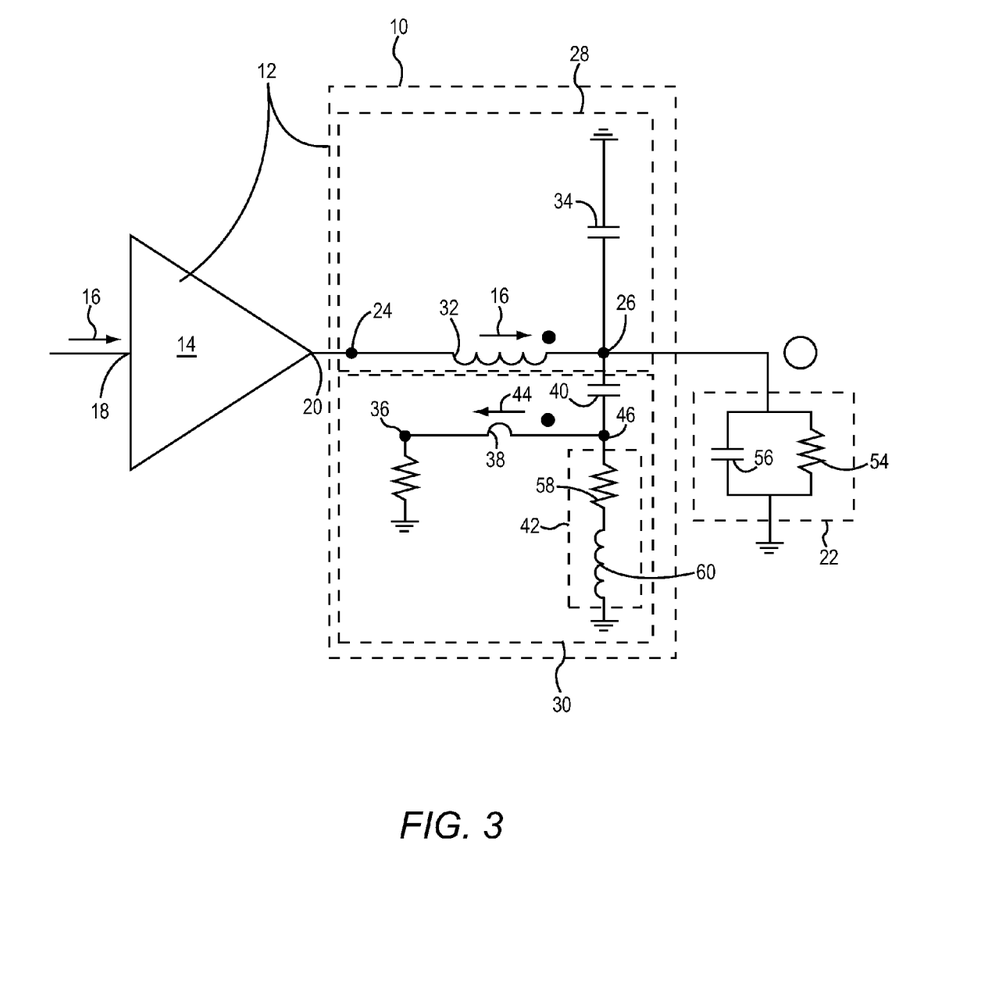
FIG. 3 illustrates an exemplary implementation of the directional coupler shown in FIG. 1 where a coupler termination is configured to operate with a load impedance that is capacitive.

FIG. 3 illustrates an example of the directional coupler 10 shown in FIG. 1 where the coupler termination 42 is configured to operate when the first impedance (e.g., the load impedance of the load 22) presented at the output port 26 is a complex impedance that is capacitive. The low pass filter 28 and the detector circuitry 30 cooperate to transform the first impedance (e.g., the load impedance of the load 22) presented at the output port 26 to the second impedance (e.g., the amplifier impedance from the amplifier output terminal 20 of the RF amplification circuit 14) presented at the input port 24. Since the first impedance in FIG. 3 is capacitive, the load 22 is modeled by a resistor 54 in parallel with a capacitor 56. The resistor 54 is used to model a real portion of the first impedance presented at the output port 26. The capacitor 56 is used to model a reactance of the first impedance presented at the output port 26, which in this example is a capacitive reactance.

In order to transform the first impedance to the second impedance and satisfy equation (11) at the particular angular frequency ω of the RF signal 16, the coupler termination impedance $Z_t$ of the coupler termination 42 also has to be a complex impedance. The coupler termination impedance $Z_t$ of the coupler termination 42 thus also has a real portion and a reactance. Given that the reactance of the first impedance presented at the output port 26 is a capacitive reactance, the reactance of the coupler termination impedance $Z_t$ of the coupler termination 42 is an inductive reactance. Accordingly, the coupler termination 42 has a resistor 58 and an inductor 60 that are connected in series with respect to one another. The resistor 58 provides a real portion of the coupler termination impedance $Z_t$ of the coupler termination 42, and the inductor 60 provides the inductive reactance of the coupler termination impedance $Z_t$ of the coupler termination 42. By providing the coupler termination impedance $Z_t$ of the coupler termination 42 with the inductive reactance, the low pass filter 28 and the detector circuitry 30 cooperate to ensure that a directivity of the directional coupler 10 is relatively high, and thus the detector signal 44 provides a measure of the RF signal 16 that is being transmitted from the input port 24 to the output port 26 while providing the appropriate impedance transformation when the first impedance (e.g., the load impedance of the load 22) at the output port 26 has the capacitive reactance. In this embodiment, the first inductance of the filter inductor 32, the second inductance of the detector inductor 38, the first capacitance of the filter capacitor 34, the capacitance $C_t$ of the sampling capacitor 40, the resistance of the resistor 58, and an inductance of the inductor 60 of the coupler termination 42 are selected so that both equation (11) and equation (14) are satisfied.

Figure 4:
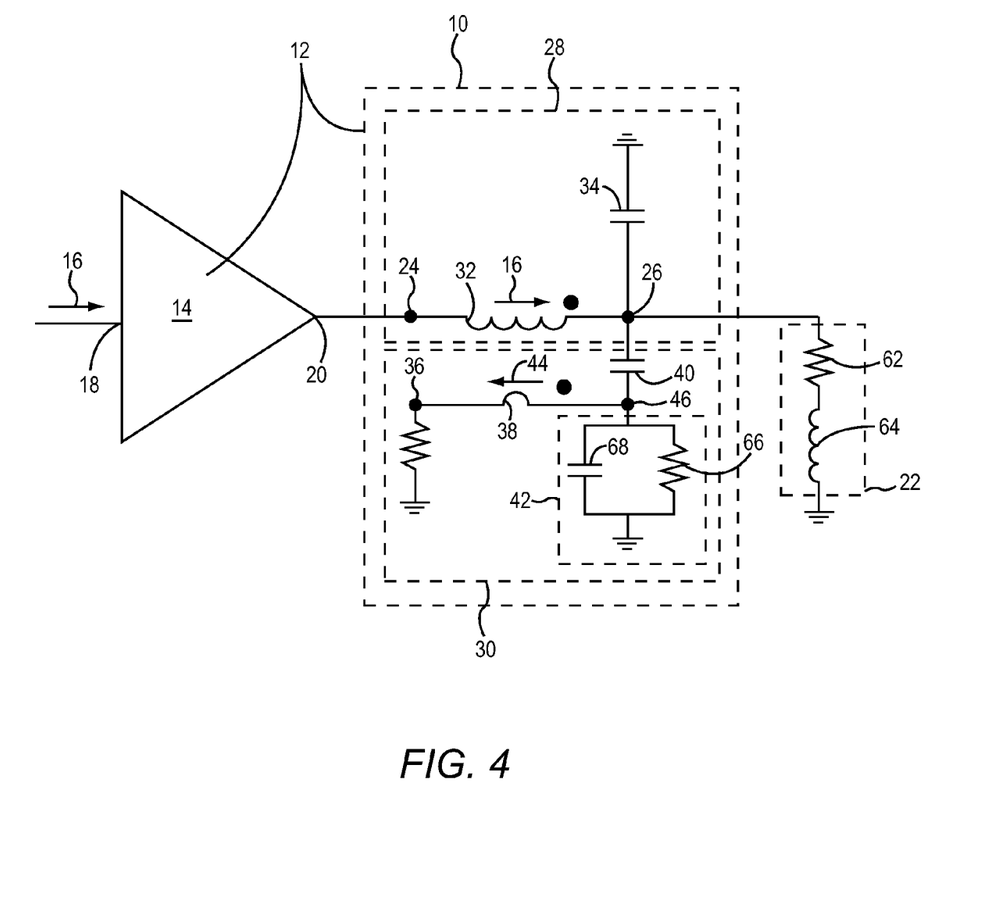
FIG. 4 illustrates an exemplary implementation of the directional coupler shown in FIG. 1 where the coupler termination is configured to operate with a load impedance that is inductive.

FIG. 4 illustrates another example of the directional coupler 10 shown in FIG. 1 where the coupler termination 42 is configured to operate when the first impedance (e.g., the load impedance of the load 22) presented at the output port 26 is a complex impedance that is inductive. The low pass filter 28 and the detector circuitry 30 cooperate to transform the first impedance (e.g., the load impedance of the load 22) presented at the output port 26 to the second impedance (e.g., the amplifier impedance from the amplifier output terminal 20 of the RF amplification circuit 14) presented at the input port 24. Since the first impedance in FIG. 4 is inductive, the load 22 is modeled by a resistor 62 in series with an inductor 64. The resistor 62 is used to model a real portion of the first impedance presented at the output port 26. The inductor 64 is used to model a reactance of the first impedance presented at the output port 26, which in this example is an inductive reactance.

In order to transform the first impedance to the second impedance and satisfy equation (11) at the particular angular frequency ω of the RF signal 16, the coupler termination impedance $Z_t$ of the coupler termination 42 also has to be a complex impedance. The coupler termination impedance $Z_t$ of the coupler termination 42 thus also has a real portion and a reactance. Given that the reactance of the first impedance presented at the output port 26 is an inductive reactance, the reactance of the coupler termination impedance $Z_t$ of the coupler termination 42 is a capacitive reactance. Accordingly, the coupler termination 42 has a resistor 66 and a capacitor 68 that are connected in parallel with respect to one another. The resistor 66 provides a real portion of the coupler termination impedance $Z_t$ of the coupler termination 42 and the capacitor 68 provides the capacitive reactance of the coupler termination impedance $Z_t$ of the coupler termination 42. By providing the coupler termination impedance $Z_t$ of the coupler termination 42 with the capacitive reactance, the low pass filter 28 and the detector circuitry 30 cooperate to ensure that a directivity of the directional coupler 10 is relatively high and thus the detector signal 44 provides a measure of the RF signal 16 that is being transmitted from the input port 24 to the output port 26 while providing the appropriate impedance transformation when the first impedance (e.g., the load impedance of the load 22) at the output port 26 has the inductive reactance. In this embodiment, the first inductance of the filter inductor 32, the second inductance of the detector inductor 38, the first capacitance of the filter capacitor 34, the capacitance $C_t$ of the sampling capacitor 40, the resistance of the resistor 66, and a capacitance of the capacitor 68 of the coupler termination 42 are selected so that both equation (11) and equation (14) are satisfied.

Figure 5:
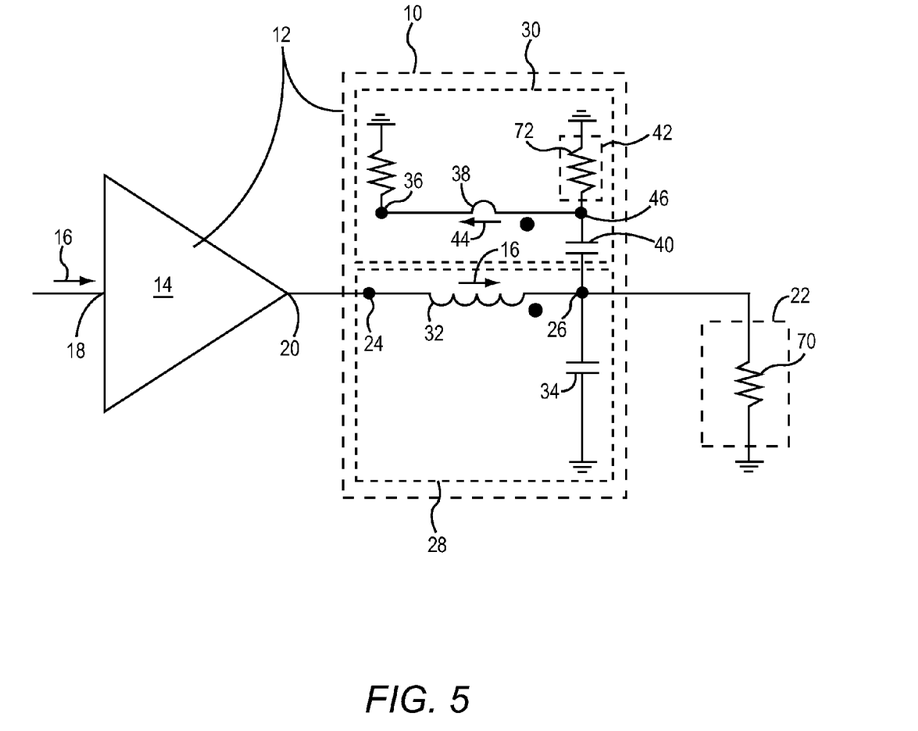
FIG. 5 illustrates an exemplary implementation of the directional coupler shown in FIG. 1 where the coupler termination is configured to operate with a load impedance that is strictly real.

FIG. 5 illustrates still another example of the directional coupler 10 shown in FIG. 1 where the coupler termination 42 is configured to operate when the first impedance (e.g., the load impedance of the load 22) presented at the output port 26 is not complex but is strictly a real impedance. The low pass filter 28 and the detector circuitry 30 cooperate to transform the first impedance (e.g., the load impedance of the load 22) presented at the output port 26 to the second impedance (e.g., the amplifier impedance from the amplifier output terminal 20 of the RF amplification circuit 14) presented at the input port 24. Since the first impedance in FIG. 5 is strictly real, the load 22 is modeled by a resistor 70. The resistor 70 is used to model the first impedance presented at the output port 26, which is strictly real since the first impedance has no reactance.

In order to transform the first impedance to the second impedance and satisfy equation (11) at the particular angular frequency ω of the RF signal 16, the coupler termination impedance $Z_t$ of the coupler termination 42 is also strictly a real impedance. Given that the first impedance presented at the output port 26 is a real impedance with no reactive portion, the coupler termination impedance $Z_t$ of the coupler termination 42 is a resistor 72. By providing the coupler termination impedance $Z_t$ of the coupler termination 42 with the real impedance, the low pass filter 28 and the detector circuitry 30 cooperate to ensure that a directivity of the directional coupler 10 is relatively high, and thus the detector signal 44 provides a measure of the RF signal 16 that is being transmitted from the input port 24 to the output port 26 while providing the appropriate impedance transformation when the first impedance (e.g., the load impedance of the load 22) at the output port 26 is also strictly a real impedance. In this embodiment, the first inductance of the filter inductor 32, the second inductance of the detector inductor 38, the first capacitance of the filter capacitor 34, the capacitance $C_t$ of the sampling capacitor 40, and a resistance of the resistor 72 of the coupler termination 42 are selected so that both equation (11) and equation (14) are satisfied.

Figure 6:
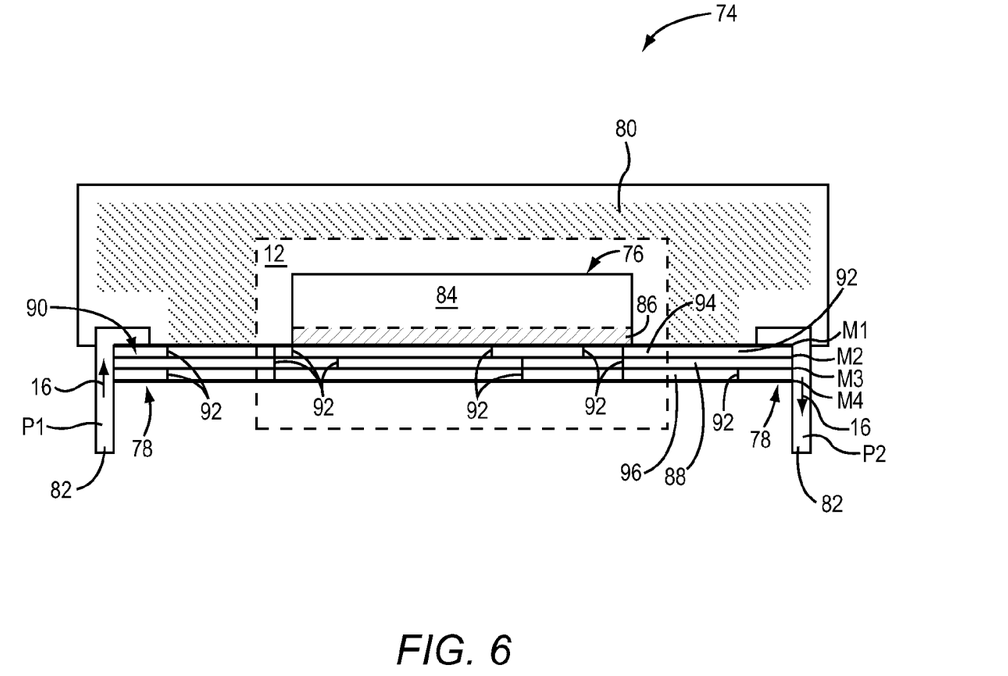
FIG. 6 illustrates a cross-sectional view of an embodiment of an integrated circuit (IC) package in which the RF amplification device that provides the directional coupler shown in FIG. 1 is integrated into the IC package.

FIG. 6 is a cross-sectional view of an embodiment of an integrated circuit (IC) package 74, which includes an exemplary implementation of the RF amplification device 12 shown in FIG. 1. The RF amplification device 12 is integrated into the IC package 74 so that the IC package 74 houses the RF amplification device 12. The IC package 74 includes a semiconductor die 76, a laminated substrate 78, molding 80, and a package interface 82 integrated into the RF amplification device 12 described above in FIG. 1. An IC is formed by the semiconductor die 76, and the semiconductor die 76 is mounted on the laminated substrate 78. In this embodiment, the RF amplification circuit 14 (shown in FIG. 1) is formed by the semiconductor die 76 as the IC or as part of the IC. The directional coupler 10 (shown in FIG. 1) of the RF amplification device 12 is also integrated into the IC package 74. As explained in further detail below, the directional coupler 10 shown in FIG. 6 is formed partially by the laminated substrate 78 and partially by the semiconductor die 76. In alternative embodiments, the directional coupler 10 may be formed entirely in the semiconductor die 76 or entirely by the laminated substrate 78. Additionally, alternative embodiments of the IC package 74 may include multiple semiconductor dice (like the semiconductor die 76), and the RF amplification device 12, including the RF amplification circuit 14 and the directional coupler 10, may be built using the multiple semiconductor dies. Other types of substrates may be mounted on the laminated substrate 78, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 76 shown in FIG. 6, the semiconductor die 76 includes a semiconductor substrate 84 used to form active semiconductor components of the IC. The semiconductor substrate 84 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 84 to provide termini of the active semiconductor components, to form passive impedance elements, and/or the like. For example, active semiconductor components of the RF amplification circuit 14 may be formed by the semiconductor substrate 84. Insulating layers, such as oxide layers, and metal layers may also be provided in or on the semiconductor substrate 84. For example, the passive impedance elements may also be formed in or on the semiconductor substrate 84 from the metallic layers.

The semiconductor die 76 also includes a Back-End-of-Line (BEOL) 86, which may be formed from a non-conductive substrate and a plurality of metallic layers provided on or in the insulating substrate. The BEOL 86 is configured to couple the components on the semiconductor substrate 84 to one another. Termini may also be provided by the BEOL 86 to provide connections by external components to the IC. The BEOL 86 may also be used to form passive impedance elements. A topology of the semiconductor die 76 formed by the semiconductor substrate 84 and the BEOL 86 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. The semiconductor die 76 is mounted on the laminated substrate 78 within the IC package 74.

The laminated substrate 78 has a laminated substrate body 88 and a metallic structure 90 integrated into the laminated substrate body 88. The laminated substrate body 88 may be formed by a plurality of laminate layers formed from a laminate material. The metallic structure 90 is formed from a stack of metallic layers M1, M2, M3, and M4 and vias 92 that connect the metallic layers M1, M2, M3, M4. The metallic layer M1 is formed on a surface 94 of the laminated substrate body 88. The semiconductor die 76 is mounted over the surface 94 and the metallic layer M1. The metallic layer M2 is provided within the laminated substrate body 88 beneath the metallic layer M1. The metallic layer M3 is formed within the laminated substrate body 88 beneath the layer M3. Finally, the metallic layer M4 is formed on a surface 96 of the laminated substrate body 88 and provides a grounding plate. The laminate material that forms the laminate layers of the laminated substrate body 88 may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers M1, M2, M3, M4 of the metallic structure 90 may be used to form termini, passive impedance components, and connections. For instance, the metallic layers are used to form connections between the semiconductor die 76 and the package interface 82. Components of the RF amplification device 12 may also be formed using the metallic layers M1, M2, M3, M4 of the metallic structure 90. The semiconductor die 76 shown in FIG. 2 is encapsulated by the molding 80, which may be formed from a non-conductive material to help insulate the semiconductor die 76 and the RF amplification device 12. In this manner, the semiconductor die 76 is protected from external electromagnetic noise generated outside the IC package 74.

Figure 7:
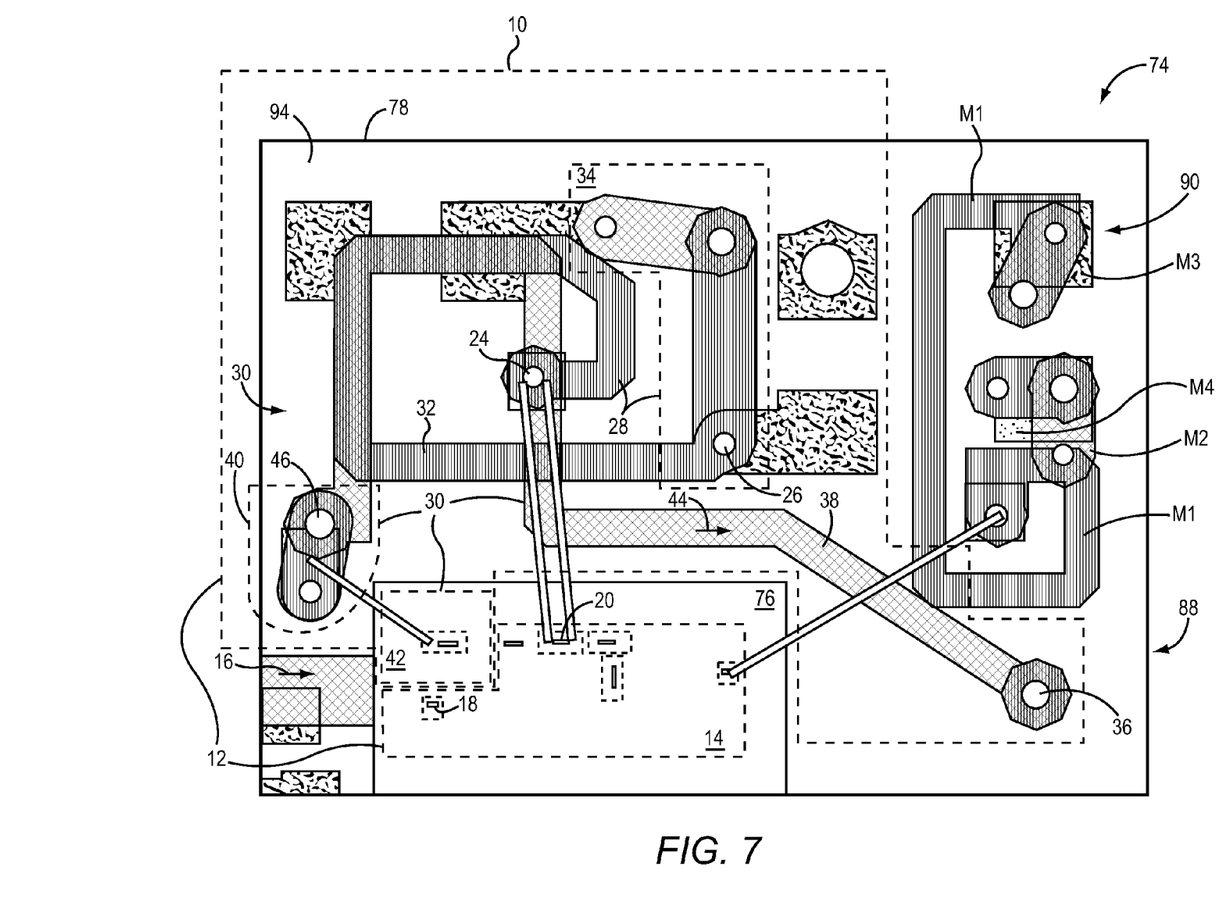
FIG. 7 illustrates the IC package shown in FIG. 6 and an exemplary arrangement of the RF amplification device integrated into the IC package.

FIG. 6 also illustrates an example of the package interface 82. In this embodiment, the package interface 82 is coupled to the metallic structure 90 so that signals can be transmitted to and received from circuitry external to the IC package 74. An embodiment of the first package terminal P1 for receiving the RF signal 16 and an embodiment of the second package terminal P2 for transmitting the RF signal 16 to the load 22 (shown in FIG. 1) are shown in FIG. 7. In this embodiment, the first package terminal P1 and the second package terminal P2 are each provided as pins connected to the laminated substrate 78.

FIG. 7 illustrates the IC package 74 shown in FIG. 6 and an exemplary arrangement of the RF amplification device 12 integrated into the IC package 74. The RF amplification circuit 14 is formed by the semiconductor die 76. More specifically, active semiconductor components that provide amplification to the RF signal 16 are formed by the semiconductor substrate 84 (shown in FIG. 6), while the amplifier input terminal 18 and the amplifier output terminal 20 are provided as external terminals by the BEOL 86 (shown in FIG. 6). In this embodiment, the directional coupler 10 is formed both by the metallic structure 90 integrated into the laminated substrate 78 and the BEOL 86 of the semiconductor die. More specifically, the low pass filter 28 is formed by the laminated substrate 78 while the detector circuitry 30 is formed partially by the laminated substrate 78 and partially by the semiconductor die 76. As shown in FIG. 7, the input port 24, the output port 26, the coupled port 36, and the common connection node 46 are formed as terminals by the metallic structure 90 of the laminated substrate 78. The filter inductor 32 and the detector inductor 38 are also formed by the metallic structure 90 integrated into the laminated substrate 78. More specifically, the filter inductor 32 is formed by the metallic layer M1 of the metallic structure 90 as windings formed by the metallic layer M1 and the detector inductor 38 is formed by the metallic layer M2 as an inductive trace. The filter inductor 32 and the detector inductor 38 are at least partially stacked over one another to provide magnetic coupling. The filter capacitor 34 of the low pass filter 28 is formed by the laminated substrate 78 using the metallic layer M1 and the metallic layer M2 of the metallic structure 90.

Also, with regard to the detector circuitry 30 shown in FIG. 7, the sampling capacitor 40 is formed using the metallic layer M1 and the metallic layer M2 of the metallic structure 90. The sampling capacitor 40 is thus also integrated into the laminated substrate 78. However, the coupler termination 42 illustrated in FIG. 7 is formed by the BEOL 86 (shown explicitly in FIG. 6) of the semiconductor die 76. To connect the coupler termination 42 in the semiconductor die 76 to ground, the metallic structure 90 of the laminated substrate 78 and the BEOL 86 form a grounding path that connects the coupler termination 42 to the metallic layer M4, which provides the ground.

It should be noted that in alternative embodiments, the coupler termination 42 may formed by the metallic structure 90 of the laminated substrate 78 rather than by the BEOL 86 of the semiconductor die 76. In this case, the directional coupler 10 may be formed entirely by the laminated substrate 78. In other alternative embodiments, the coupler termination 42 is integrated into the semiconductor substrate 84 (shown explicitly in FIG. 6) instead of the BEOL 86. Also note that in still other alternative embodiments, the directional coupler 10 may be formed entirely in the semiconductor die 76. For instance, the directional coupler 10 may be integrated entirely into the semiconductor substrate 84, entirely into the BEOL 86, or integrated partially into the semiconductor substrate 84 and partially into the BEOL 86.

Those skilled in the art will recognize improvements and modifications to the preferred embodiments of the present disclosure. All such improvements and modifications are considered within the scope of the concepts disclosed herein and the claims that follow.

What is claimed is:

1. A directional coupler, comprising:
   an input port;
   an output port;
   a low pass filter comprising a filter inductor and a filter capacitor, wherein the filter inductor is coupled between the input port and the output port and has a first inductance and wherein the filter capacitor is coupled between the output port and ground; and
   detector circuitry coupled to the filter inductor and comprising a detector inductor having a second inductance such that the first inductance of the filter inductor is greater than the second inductance of the detector inductor, wherein the detector inductor is magnetically coupled to the filter inductor such that current passing through the filter inductor generates a detector current through the detector inductor and wherein the low pass filter and the detector circuitry cooperate to transform a first impedance presented at the output port substantially to a second impedance presented at the input port.

2. The directional coupler of claim 1 wherein the detector circuitry further comprises a coupled port coupled to the detector inductor and the detector circuitry is further configured so as to increase directivity between a forward signal voltage at the output port and a coupled voltage at the coupled port.

3. The directional coupler of claim 1 wherein the detector circuitry further comprises a sampling capacitor coupled between the filter inductor and the detector inductor.

4. The directional coupler of claim 1 wherein the detector circuitry further comprises a coupler termination coupled between the detector inductor and ground.

5. The directional coupler of claim 1 wherein the detector circuitry is further configured to minimize power reflections.

6. The directional coupler of claim 1 wherein the detector circuitry is further configured to balance the current across through the filter inductor with the detector current through the detector inductor.

7. The directional coupler of claim 1 wherein the detector circuitry is coupled to the filter inductor by being connected to the output port.

8. The directional coupler of claim 1 wherein the detector circuitry further comprises:
   a coupled port coupled to the detector inductor;
   a sampling capacitor coupled between the output port and the detector inductor such that the detector inductor is coupled between the sampling capacitor and the coupled port;
   a coupler termination coupled between the sampling capacitor and ground.

9. The directional coupler of claim 8 wherein:
the sampling capacitor is configured to provide a sampled voltage based on an output voltage at the output port such that the sampled voltage adjusts a first inductor voltage across the detector inductor;
the coupler termination having a termination impedance that provides a weight to the sampled voltage such that the current through the filter inductor and the detector current across the detector inductor are substantially balanced.

10. The directional coupler of claim 8 wherein:
the sampling capacitor is configured to provide a sampled voltage based on an output voltage at the output port such that the sampled voltage adjusts a first inductor voltage across the detector inductor;
the coupler termination having a termination impedance that provides a weight to the sampled voltage such that the output voltage at the output port is substantially balanced with a coupled voltage at the coupled port.

11. The directional coupler of claim 8 wherein:
the sampling capacitor is configured to provide a sampled voltage based on an output voltage at the output port such that the sampled voltage adjusts a first inductor voltage across the detector inductor;
the coupler termination having a termination impedance that provides a weight to the sampled voltage so as to increase directivity between a forward signal voltage at the output port and a coupled voltage at the coupled port.

12. The directional coupler of claim 1 wherein:
the detector circuitry is coupled to the filter inductor by being connected to an intermediate tap of the filter inductor;
a first portion of the filter inductor coupled between the input port and the intermediate tap is magnetically coupled to the detector inductor, wherein a third inductance of the first portion of the filter inductor is greater than the second inductance of the detector inductor.

13. The directional coupler of claim 12 wherein a second portion of the filter inductor coupled between the intermediate tap and the output port is not magnetically coupled to the detector inductor.

14. The directional coupler of claim 12 wherein the detector circuitry further comprises:
a coupled port coupled to the detector inductor;
a sampling capacitor coupled between the intermediate tap and the detector inductor such that the detector inductor is coupled between the sampling capacitor and the coupled port;
a coupler termination coupled between the sampling capacitor and ground.

15. The directional coupler of claim 14 wherein:
the sampling capacitor is configured to provide a sampled voltage based on an intermediate voltage at the intermediate tap such that the sampled voltage adjusts a first inductor voltage across the detector inductor;
the coupler termination having a termination impedance that provides a weight to the sampled voltage such that the current through the filter inductor and the detector current across the detector inductor are substantially balanced.

16. The directional coupler of claim 14 wherein:
the sampling capacitor is configured to provide a sampled voltage based on an intermediate voltage at the intermediate tap such that the sampled voltage adjusts a first inductor voltage across the detector inductor;
the coupler termination having a termination impedance that provides a weight to the sampled voltage such that the intermediate voltage at the intermediate tap is substantially balanced with a coupled voltage at the coupled port.

17. The directional coupler of claim 14 wherein:
the sampling capacitor is configured to provide a sampled voltage based on an intermediate voltage at the intermediate tap such that the sampled voltage adjusts a first inductor voltage across the detector inductor;
the coupler termination having a termination impedance that provides a weight to the sampled voltage so as to increase directivity between a forward signal voltage at the intermediate tap and a coupled voltage at the coupled port.

18. The directional coupler of claim 1 wherein the low pass filter and the detector circuitry cooperate to transform the first impedance presented at the output port to the second impedance presented at the input port when the first impedance is a first complex impedance.

19. The directional coupler of claim 18 wherein the detector circuitry further comprises a coupler termination coupled between the detector inductor and ground and having a second complex impedance such that the low pass filter and the detector circuitry cooperate to transform the first complex impedance presented at the output port to the second impedance presented at the input port.

20. The directional coupler of claim 19 wherein:
the first complex impedance has capacitive reactance; and
the second complex impedance is inductive reactance.

21. The directional coupler of claim 19 wherein:
the first complex impedance has inductive reactance; and
the second complex impedance is capacitive reactance.

22. The directional coupler of claim 1 integrated into an integrated circuit (IC) package that includes a laminated substrate and a semiconductor die mounted on the laminated substrate.

23. The directional coupler of claim 22 wherein the detector circuitry further comprises a coupler termination coupled between the detector inductor and ground and wherein:
the filter inductor and the detector inductor are formed by a metallic structure integrated into the laminated substrate; and
the coupler termination is formed by a Back End Of Line (BEOL) of the semiconductor die.

24. A method of providing directional coupling comprising:
receiving an RF signal at an input port;
transforming a first impedance presented at an output port to a second impedance presented at the input port with a low pass filter and detector circuitry, wherein the low pass filter comprises a filter inductor and a filter capacitor, wherein the filter inductor is coupled between the input port and the output port and has a first inductance, and wherein the filter capacitor is coupled between the output port and ground;
generating a detector current through a detector inductor that is magnetically coupled to the filter inductor, wherein the detector inductor is provided by detector circuitry and the first inductance of the filter inductor is greater than a second inductance of the detector inductor; and
transmitting the RF signal from the output port once the RF signal is filtered by the low pass filter.

25. The method of claim 24 further comprising increasing directivity between a forward signal voltage at the output port and a coupled voltage at a coupled port coupled to the detector inductor using the detector circuitry.

26. The method of claim 24 further comprising minimizing power reflections with the detector circuitry.

27. An RF amplification device comprising:
an RF amplification circuit to amplify an RF signal;
a directional coupler operably associated with the RF amplification circuit such that the RF amplification circuit presents an amplifier impedance to the directional coupler and configured to be coupled to a load such that the load presents a load impedance to the directional coupler, the directional coupler comprising:
a low pass filter comprising a filter inductor having a first inductance and a filter capacitor, wherein the filter inductor is coupled so that the RF signal passes across the filter inductor and the filter capacitor is coupled so as to be in shunt with respect to the load; and
detector circuitry coupled to the filter inductor and comprising a detector inductor having a second inductance such that the first inductance of the filter inductor is greater than the second inductance of the detector inductor, wherein the detector inductor is magnetically coupled to the filter inductor such that a detector current is generated through the detector inductor in response to the RF signal passing across the filter inductor and wherein the low pass filter and the detector circuitry cooperate to transform the load impedance to the amplifier impedance.

28. The RF amplification device of claim 27 wherein the detector circuitry further comprises a coupled port coupled to the detector inductor and the detector circuitry is further configured so as to increase directivity between a forward signal voltage to the load and a coupled voltage at the coupled port.

29. The RF amplification device of claim 27 wherein only the directional coupler is connected between the RF amplification circuit and the load.

30. The RF amplification device of claim 27 wherein the detector circuitry is further configured to minimize power reflections between the load and the RF amplification circuit.

* * * * *